United States Patent [19]

Ciszek et al.

[11] 4,152,194

[45] May 1, 1979

[54] GROWTH OF SILICON CARBIDE CRYSTALS ON A SEED WHILE PULLING SILICON CRYSTALS FROM A MELT

[76] Inventors: Robert A. Frosch, Administrator of the National Aeronautics and Space Administration, with respect to an invention of Theodore F. Ciszek, Salt Point; Guenther H. Schwuttke, Poughkeepsie, both of N.Y.

[21] Appl. No.: 820,499

[22] Filed: Jul. 29, 1977

[51] Int. Cl.$^2$ ............................................. B01J 17/20
[52] U.S. Cl. ..................... 156/617 SP; 156/DIG. 68; 423/345
[58] Field of Search .......... 156/DIG. 68, 608, 617 SP, 156/605, DIG. 88; 23/273 SP; 423/345

[56] References Cited

U.S. PATENT DOCUMENTS

| 2,996,415 | 8/1961 | Hergenrother | 156/DIG. 68 |
| 3,053,635 | 9/1962 | Shockley | 156/DIG. 68 |

OTHER PUBLICATIONS

Swartz et al., J. of Electronic Materials, vol. 4, #2, 1975, pp. 255–279.

*Primary Examiner*—Stephen J. Emery
*Attorney, Agent, or Firm*—Wilfred Grifka; John R. Manning; Monte F. Mott

[57] ABSTRACT

A saturated solution of silicon and an element such as carbon having a segregation coefficient less than unity is formed by placing a solid piece of carbon in a body of molten silicon having a temperature differential decreasing toward the surface. A silicon carbide seed crystal is disposed on a holder beneath the surface of the molten silicon. As a rod or ribbon of silicon is slowly pulled from the melt, a supersaturated solution of carbon in silicon is formed in the vicinity of the seed crystal. Excess carbon is emitted from the solution in the form of silicon carbide which crystallizes on the seed crystal held in the cool region of the melt.

10 Claims, 4 Drawing Figures

GROWTH OF SILICON CARBIDE CRYSTALS ON A SEED WHILE PULLING SILICON CRYSTALS FROM A MELT

ORIGIN OF THE INVENTION

The invention described herein was made in the performance of work under a NASA contract and is subject to the provisions of Section 305 of the National Aeronautics and Space Act of 1958, Public Law 83-568 (72 Stat. 435; USC 2457).

BACKGROUND OF THE INVENTION

1. Field of the Invention

The present invention relates to growth of single crystals from molten solutions and, more particularly, to the production of silicon carbide crystals from a weak solution of carbon in silicon.

2. Description of the Prior Art

Silicon carbide is of considerable interest because, as a large bandgap semiconductor, electronic junction devices made from it can operate at much higher temperatures than those made from germanium or silicon. However, no successful technique has been devised to grow large, pure single crystals of silicon carbide. It cannot be solidified from the melt at reasonable pressures. It has been grown from molten metal and molten silicon solutions. However, the very low solubility in molten metals allowed only small crystals to be grown. The usual method of producing silicon carbide crystals is by decomposition of $SiHCL_3$ and a hydrocarbon gas such as methane from the gas phase which deposits onto a substrate. This process is complex, difficult to control and limited to production of small grain, single crystals of 1 cm or less.

SUMMARY OF THE INVENTION

A novel method for producing crystals of silicon compound from weak molten solutions is provided in accordance with the invention. Large single crystals are produced and spurious crystals are avoided by disposing a seed crystal in a cool region near the surface of the melt containing a supersaturated zone of the co-crystallizing element. The supersaturated zone is created and maintained by slowly pulling a silicon rod or ribbon from the surface of the melt. Since the segregation coefficient of the co-crystallizing element is less than unity, the element is rejected into the solution as the silicon solidifies and forms a zone supersaturated with the element. The excess element is emitted from the zone in the form of crystals of silicon compound which crystallize on the seed crystal disposed in the cool region of the melt just below the solidifying silicon member.

The silicon rod can be reused to form a new batch of melt or may be utilized as a crystalline silicon substrate material for semi-conductors, solar cells or other purposes.

The invention is generally applicable to the formation of crystals of silicon combined with elements having very low solubility of less than 1000 parts per million in silicon and having a segregation coefficient of less than unity in silicon. The solubility limit of carbon in silicon is about 100 parts per million at the temperature of molten silicon* and the segregation coefficient is about 0.05**. The segregation coefficients of boron and copper in silicon are both less than unity.

* R. I. Scace and G. A. Slack, The Si-C and Ge-C Phase Diagrams. Proceedings of the Conference on Silicon Carbide, Boston, April 1959. Pergamon Press, New York (1960).
** T. N. Tucker, Distribution Coefficient of Carbon in Silicon, paper presented at the October 1968 Meeting of the Electrochemical Society, Montreal, Canada.

All starting materials should be of very high purity and all surfaces should be non-nucleating to silicon carbide, suitably quartz. The seed crystal should be positioned as close as possible to the end of the silicon crystal but not so close as to interface with the pulled crystal, suitably 0.5 to 2 cm, generally about 1 cm. The seed crystal must be moved downwardly to maintain the spacing to the pulled crystal as the molten silicon level drops due to silicon crystallization and removal from the melt onto the pulled crystal.

The temperature in the cool supersaturated zone is at the temperature of phase transformation of silicon liquid to solid, i.e. about 1412°-5° C. The temperature differential from the cool zone to the lower portion of the melt in which is disposed a source of the element is generally from 50° C. to 150° C., preferably less than 100° C. The process can be operated in an inert atmosphere such as under vacuum or an inert gas such as argon. Generally a positive overpressure of 2 psi is utilized to assure outgassing of impurities from the system. The pulling rate is adjusted to withdraw sufficient silicon so as to maintain a zone supersaturated with carbon. This, of course, depends on the rate carbon is removed from the supersaturated zone as silicon carbide crystals. The pulling rate is generally from 0.1 mm/min to 10 mm/min depending on the diameter of the rod, usually about 1 mm/min.

These and many other objects and attendant advantages of the invention will become readily apparent as the invention becomes better understood by reference to the following detailed description when considered in conjuction with the accompanying drawings.

DESCRIPTION OF THE PREFERRED EMBODIMENTS

Figure 1:
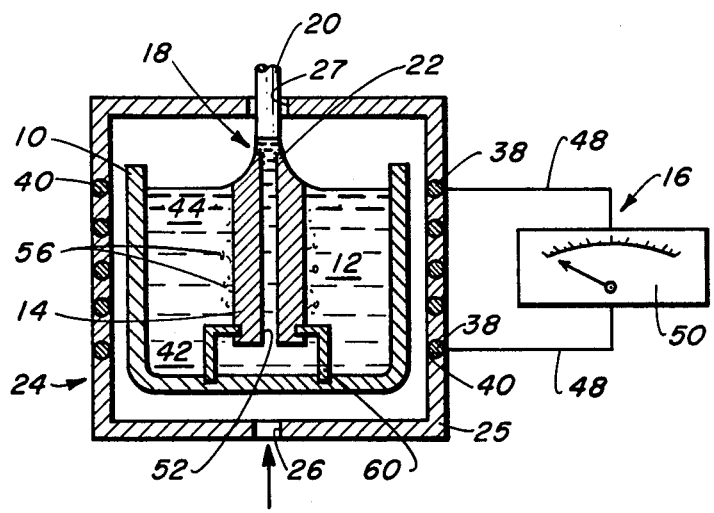
FIG. 1 is a schematic view of a first embodiment of the invention.
Figure 1A:
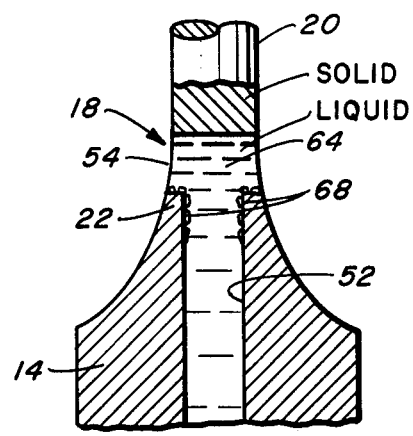
FIG. 1a is an enlarged view of the solid-liquid interface of rod and molten solution.

Referring now to FIGS. 1 and 1a, the crystal-growing apparatus of the invention generally includes a crucible 10 containing a body of molten silicon 12, a source 14 of crystallizing element, differential heating means 16, means for crystallizing 18 a silicon compound crystal disposed in the cooler region of the melt 12 and silicon crystal pulling means 20, the upper die end 22 being disposed adjacent the crystallizing means 18. The crucible 10 is disposed within an enclosure 24 of a suitable furnace and an inert atmosphere is maintained within the furnace by means of vacuum or by overpressuring the system with inert gas such as argon introduced into the enclosure 24 through inlet 26 and which leaves the system through any openings such as the pass-through 27 for silicon rod puller 20.

Differential heating means 16 may take many diverse forms, readily available commercially which are capable of maintaining the desired temperature differential in which the lowest zone 42 of the melt is maintained at a temperature of about 1500° C. while the highest cooler zone 44 is maintained at the crystallization temperature of silicon, about 1415° C. Typically, the heating means 16 is a picket fence graphite heater in which high resistance graphite rods 38 are housed within slots 40 disposed within the wall 25 of the furnace enclosure. A temperature differential can be maintained by varying the diameter of each rod 38 or tapering the rods along their length. The rods are heated by means of conductors 48 connected to power source and controller 50.

The silicon pulling means depicted comprises a ribbon puller in which the die 22 includes a capillary slot 52 into which the molten, carbon saturated silicon creeps upwardly by capillary action from the meniscus 54 of the melt. The high purity graphite rod 14 held in the crucible by means of holder 60 slowly dissolves to emit carbon atoms 56 which enter the melt to form a saturated silicon solution containing one hundred parts per million of carbon. As the silicon ribbon forms within the capillary slot 52 and is pulled upwardly by die puller 20, carbon is emitted back into the melt within the cooler zone 44 and forms a supersaturated sub-zone 64. The excess carbon is emitted from solution in the form of β-silicon carbide crystals 68 which deposit on the end of the die 22.

Silicon carbide crystals were grown in an apparatus similar to that of FIG. 1. A rectangular piece of high purity graphite was dipped into a molten silicon solution having a cool zone at the top of the melt at a temperature of about 1415° C. and a bottom hotter zone temperature of 1500° C. The graphite was dipped into solution for approximately one hour while solidifying a continuous ribbon of silicon from the melt fed to the top of the graphite piece by capillary action. After removal of the graphite piece, well-developed β-silicon carbide crystals were observed on the top surface of the graphite piece. The crystals ranged in size from 0.1 to 1 mm.

Identification of the crystal structure of the crystals scraped from the graphite piece was made through X-ray diffraction analysis. A few crystals were attached to a glass rod and Debye-Scherrer diffraction patterns were obtained. The d-spacings measured from the films were checked against the A.S.T.M. card file. The crystals were identified as β-silicon carbide. This zinc-blend type structure (cubic form) has a lattice constant of a =4.358 Å. The measurements are summarized in Table 1.

TABLE 1

| CRYSTAL | | REFLECTION | A.S.T.M. CARD #1-119 β-SiC | |
|---|---|---|---|---|
| d | $I_o$ | HKL | d | $I/I_1$ |
| 2.51 | S | 111 | 2.51 | 100 |
| 2.18 | M | 200 | 2.17 | 20 |
| 1.54 | M | 220 | 1.54 | 63 |
| 1.315 | M | 311 | 1.31 | 50 |
| 1.27 | W | 222 | 1.26 | 5 |
|  |  | 400 | 1.09 | 6 |
| 1.00 | W | 331 | 1.00 | 18 |
| 0.975 | W | 420 | 0.97 | 6 |
| 0.89 | W | 422 | 0.89 | 13 |
| 0.84 | W | 333,511 | 0.84 | 10 |

Figure 2:
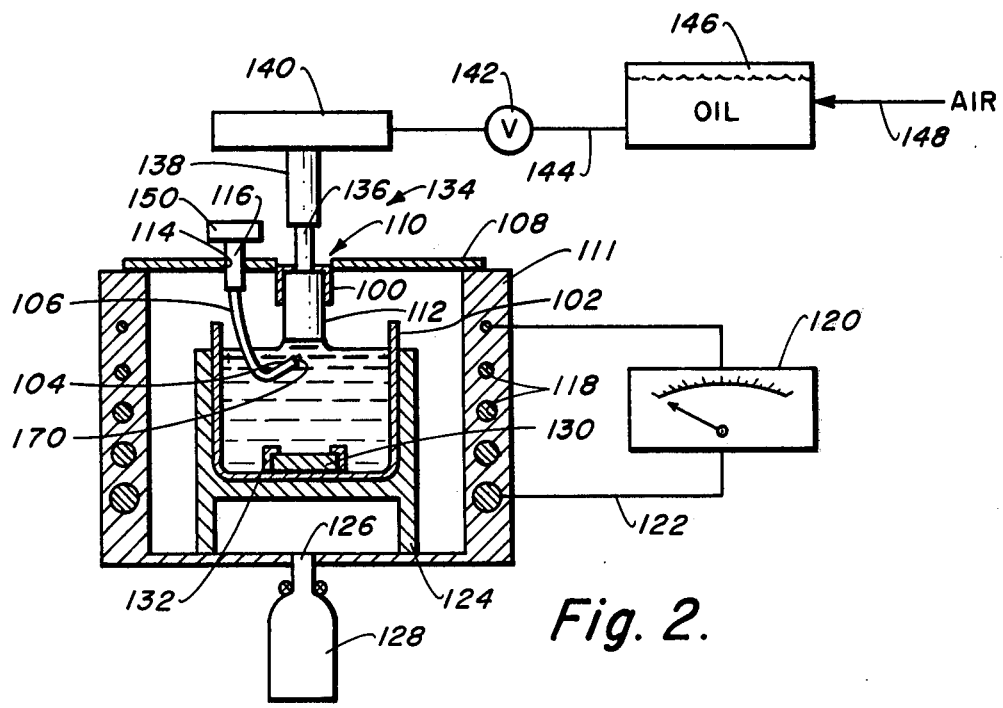
FIG. 2 is a schematic view of a further embodiment of the invention.
Figure 2A:
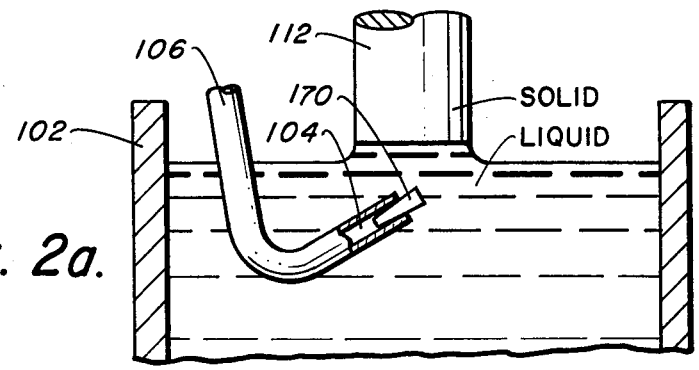
FIG. 2a is an enlarged view of the SiC seed crystal holder.

Larger silicon carbide crystals can be grown and spurious nucleation can be avoided by localizing silicon carbide crystal growth in a preselected area of the melt and by maintaining proper spacing between the growing silicon carbide crystal and the interface with the growing silicon rod or ribbon. In the system of FIG. 2, all components in the cool zone are formed of quartz, such as the crucible 102, the silicon carbide seed holder 104 and attaching rod 106. The top 108 of the furnace shell 111 has a first pass-through 110 for the pulling rod 112 and a second pass-through 114 for the movable seed holder piston 116.

The furnace shell contains variable cross-section graphite heating rods 118 connected to variable power source 120 by means of conductors 122. The bottom wall 124 of the furnace shell has an inlet port 126 connected to the source of argon 128. A piece of high purity graphite 130 is held in the bottom of the crucible by quartz holders 132. A rotatable silicon rod holder 100 which can be formed of metal or graphite is connected to a hydraulically-actuated pulling mechanism 134. The mechanism 134 includes a piston 136 and a hydraulic cylinder 138 connected to a source of pressurized hydraulic oil 140. Speed adjustment is obtained by means of a needle valve 142 disposed in the oil flow line 144 between the hydraulic cylinder and the oil reservoir tank 146 which is suitably pressurized by air 148. The hydraulic piston system 116 on the movable seed crystal holder may suitably be adjusted by a variable hydraulic fluid source 150.

The system of FIG. 2 is operated by turning on argon source 128 such that argon flows through the system and out the pass-throughs 110, 114. A piece of high purity graphite 130 is engaged within the clamps 132 and high purity silicon is placed within the crucible. The controller 120 is energized to heat the bottom of the crucible to a temperature of about 1500° C. and the top of the melt to a temperature of 1415° C. After the molten silicon is saturated with carbon, the rod pulling mechanism 134 is actuated and slowly pulls the rod 112 upwardly. As the level of silicon solution falls the hydraulic mechanism 150 is actuated to slowly lower the holder rod 106 such that the seed crystal 170 and the silicon carbide crystal growing thereon is maintained about 1 cm below the surface of the forming silicon rod.

It is to be understood that only preferred embodiments of the invention have been described and that numerous substitutions, modifications and alterations are permissible without departing from the spirit and scope of the invention as defined in the following claims.

What is claimed is:

1. A method of growing silicon carbide crystals comprising the steps of:

placing solid carbon in the lower portion of a body of silicon;

heating the body of silicon to melt the silicon and dissolve the carbon therein to form a weak solution of carbon in silicon while maintaining the top portion of the solution near the crystallizing temperature of silicon;

pulling a silicon crystal from the surface of the solution while rejecting carbon into the top portion of the solution to form a zone supersaturated with carbon;

supporting a seed crystal of silicon carbide within the zone adjacent the interface of the pulled silicon crystals; and growing a crystal of silicon carbide on the seed crystal.

2. A method according to claim 1 further including the step of moving the seed crystal downwardly as said interface moves downwardly.

3. A method according to claim 2 further including the step of heating the solution at a differential temperature such that the lower portion is at a temperature no more than 150° C. higher than the temperature at the top portion of the solution.

4. A method according to claim 3 in which the carbon is in the form of a solid piece of high purity graphite and further comprising the step of securing the piece within the lower portion of the solution.

5. A method according to claim 4 in which the top portion of the solution is at a temperature of about 1415° C. and the lower portion is at a temperature of about 1500° C.

6. A method according to claim 5 in which all surfaces in contact with the solution except for the seed crystal are non-nucleating to crystals of silicon carbide.

7. A method according to claim 6 in which the non-nucleating surfaces are formed of quartz.

8. A method according to claim 5 in which the lower portion is at a temperature no more than 100° C. higher than the temperature at the top portion of the solution.

9. A method according to claim 8 in which the silicon carbide seed crystal is positioned from 0.5 to 2 cm from the end of the silicon crystal.

10. A method according to claim 9 in which the silicon crystal is pulled from the solution at a rate of about 0.1 mm/min.

* * * * *